United States Patent [19]

Grey, Jr. et al.

[11] 4,452,664
[45] Jun. 5, 1984

[54] METHOD FOR PREDETERMINING PEEL STRENGTH AT COPPER/ALUMINUM INTERFACE

[75] Inventors: Delton A. Grey, Jr., Scotia; Robert W. Green, Esperance, both of N.Y.

[73] Assignee: General Electric Company, Schenectady, N.Y.

[21] Appl. No.: 519,280

[22] Filed: Aug. 1, 1983

[51] Int. Cl.$^3$ .............................................. B44C 1/00
[52] U.S. Cl. ..................................... 156/631; 134/1; 156/629; 156/643; 156/665; 156/235; 156/249; 156/344; 427/309
[58] Field of Search ............... 156/629, 631, 632, 634, 156/643, 656, 665, 235, 238, 241, 247, 249, 344, 901, 902; 427/38, 39, 309 A; 204/192 EC, 192 E; 134/1

[56] References Cited

U.S. PATENT DOCUMENTS 3,620,933 11/1971 Grunwald et al. ............. 156/631 X
4,282,266 8/1981 Fisher .............................. 156/626 X
4,354,895 10/1982 Ellis ..................................... 156/631
4,372,804 2/1983 Hanabusa et al. .................. 156/631

FOREIGN PATENT DOCUMENTS 990692 4/1965 United Kingdom .
1355927 6/1974 United Kingdom .
1370893 10/1974 United Kingdom .
1458260 12/1976 United Kingdom .

*Primary Examiner*—William A. Powell
*Attorney, Agent, or Firm*—Leo I. MaLossi; James C. Davis, Jr.; James Magee, Jr.

[57] ABSTRACT

A low temperature (about 0° C. to about 100° C.) method is disclosed for forming an ultrathin film of copper on an aluminum carrier sheet. By this method, which employs matte finish aluminum foil, the peel strength for separating the aluminum carrier from the copper film can be preset at a desired value between 0.1 and 2 pounds per inch.

11 Claims, 6 Drawing Figures

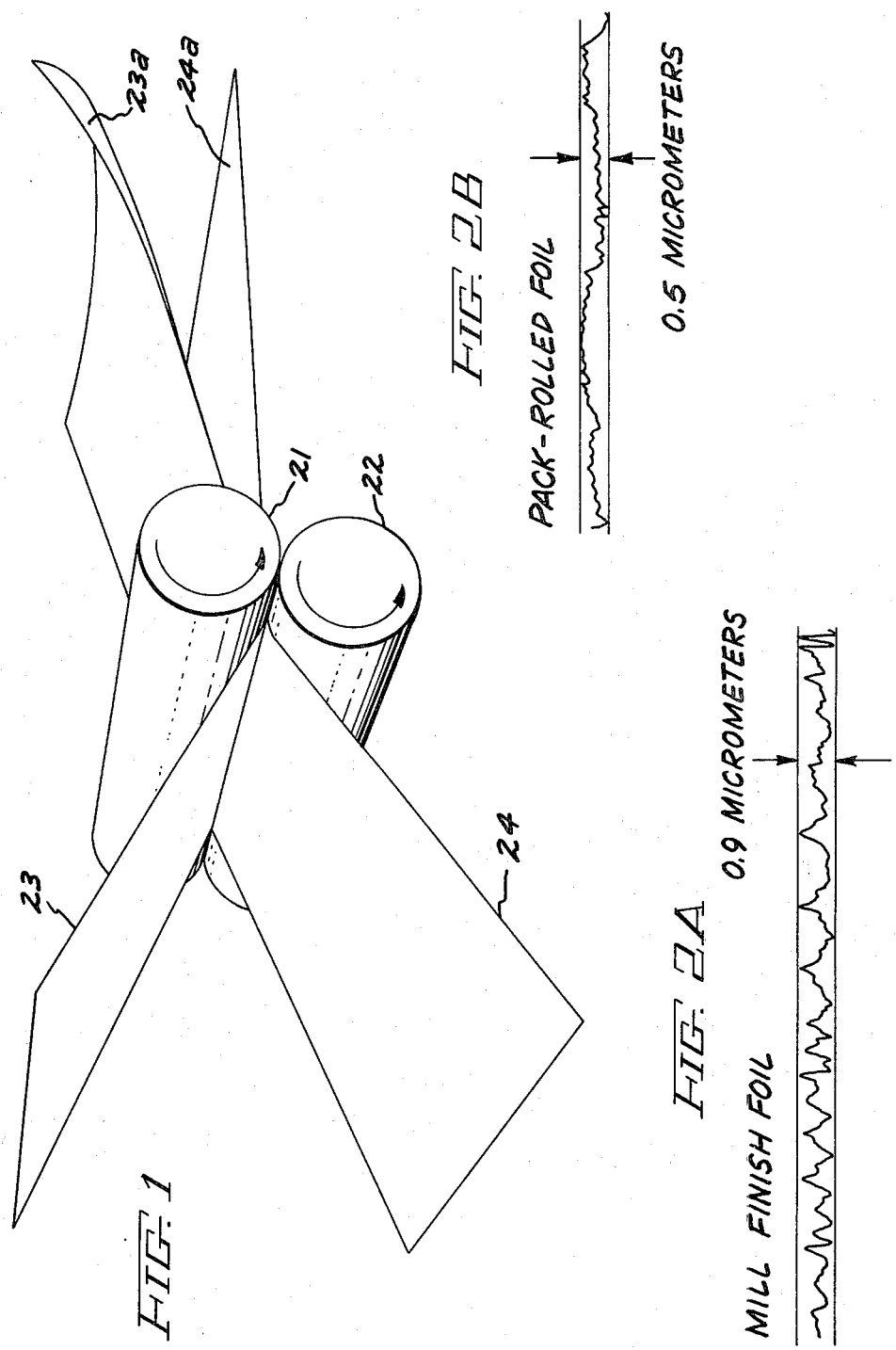

METHOD FOR PREDETERMINING PEEL STRENGTH AT COPPER/ALUMINUM INTERFACE

The invention relates particularly to a new method for making laminate precursors employed in the preparation of copper-clad assemblies having special utility in the production of high-resolution printed circuit boards.

This invention is related to the invention disclosed and claimed in copending U.S. patent application Ser. No. 499,019 - Lifshin, et al., filed May 27, 1983. The Lifshin, et al. application is directed to the method of depositing copper directly on a smooth (±8 microinches root mean square) chemically clean aluminum foil carrier surface by vapor deposition while controlling the adhesion between the copper and the carrier surface. This is accomplished by heating the foil to maintain the surface on which the deposition occurs at a temperature in the range of from about 100° C. to about 250° C. with the result that the peel strength (i.e., the force required to separate these components) is to be between about 0.20 at 2.0 pounds/inch.

In the practice of the Lifshin et al. process close control over the heating of the aluminum foil is necessary to prevent the occurrence of temperature excursions sufficient to soften the foil or distort the final product. Also, the construction and operation of the vacuum system in which the copper deposition occurs are more expensive than would be the case, if a lower temperature range could be employed.

As this technology has progressed, ever thinner films of copper have been utilized with this trend being limited in large part by the character of the surface roughness of the mill finish of the commercial aluminum foil used as the carrier. The depositing copper, of course, tends to replicate the surface structure of the aluminum foil, expecially in the early stages of the deposition. Thus, when copper films 5 microns or less in thickness are deposited, sharp ridges on the aluminum surface result in either a very thin layer of copper on the ridges or no copper (in which case a pin hole will result in the copper film when the aluminum carrier is physically removed from the copper film). This invention also addresses this limitation in the prior art.

Copper-clad assemblies utilizing the laminate precursors of this invention may advantageously prepared by the practice of the invention set forth in U.S. patent application Ser. No. 406,588 - Green, et al., filed Aug. 9, 1982. According to the Green, et al. invention, a bonding system comprising a metal oxide layer and a coupling agent layer is used to interconnect the copper film of the laminate precursor to a resin-bonded, glass-reinforced substrate.

U.S. Pat. No. 3,969,199 - Berdan, et al. is illustrative of the prior art patents utilizing an aluminum carrier sheet as a substrate for the deposition and handling of a copper layer. In Berdan, et al. the copper is deposited by electroplating and carrier sheet surface modification is relied upon to develop a desired peel strength.

Aforementioned applications Ser. Nos. 406,588 and 499,019 are incorporated by reference, both being assigned to the assignee hereof.

DEFINITIONS

"Ultra-thin" designates thickness less than about 16 microns.

"Film" means an ultra-thin coating and the combination of such coating and one or more ultra-thin coatings of another metal or other material.

"Vapor deposition" means and includes sputtering, physical evaporation (i.e., electron beam, inductive and/or resistive evaporation), chemical vapor deposition, and ion plating.

"Substrate", as that term is used in this specification and the appended claims, means and refers to that part of the copper-clad assembly (or other article of manufacture of this invention) which serves as the physical support means for the metal film or foil being suitably a glass-epoxy body provided in the form of a prepreg for cure in contact with the copper foil. Other materials useful for this purpose include, but are not limited to, that known in the trade as "phenolic paper resins" which are paper sheet products impregnated with a resin curable to provide an adhesive bond between the substrate and the metal foil of the laminate. Still other such materials are polyimides and polyester resins.

"Bondable surface area" means and includes that portion of the surface area of the carrier sheet occupied by naturally-occurring oxide(s) or exposed carrier metal.

"Chemically clean" when applied to commercial aluminum foil indicates that the hydrocarbon contamination (e.g., due to the presence of drawing lubricants used during cold reduction passes in the preparation of aluminum foil from aluminum billets) has been substantially reduced by the use of chemical cleaning. Typically, such cleaning of aluminum foil begins with vapor degreasing in a solvent, such as trichlorethylene, followed by cleaning with an appropriate aqueous solution of an alkaline cleaner and, finally, a pressurized water rinse. Determinations of hydrocarbon contamination on chemically clean aluminum have established residual hydrocarbon contamination in the range of from about 0.3 to about 1.0 $\mu g/cm^2$ (micrograms per square centimeter).

"Peel strength" is indicated as being the measurement of force in pounds required to separate, for example, a 1-inch wide strip of the carrier sheet from the copper film (the copper film being anchored to the substrate) when pulled at an angle of 90°. Regardless of the actual lineal width of strip pulled during the test, this parameter is expressed in lbs/lineal inch.

"Mill finish" applied to aluminum foil merely indicates that the surfaces of the foil are those resulting from contact of the foil with the steel rolls during the last reduction pass in converting an aluminum billet to aluminum foil. The foil surface replicates the ground surface of the roll with which it makes contact. If the surface of the roll has been made particularly smooth by stone polishing, it is customary in the trade to refer to the resulting finish of the rolled foil as a "bright finish". Such a special finish would have a surface roughness of about 5–12 microinches (peak-to-valley, equivalent to about 0.2 micrometers), in general, the degree of foil smoothness referred to in Ser. No. 499,019. Surface roughness in all mill finishes has two components, background roughness and random sharp ridges. The latter reflect the inevitable scratches present on the roll surfaces. Measurements of a number of commercial mill finish foils by interference microscopy has established that whereas background roughness will vary in absolute deviation (peak-to-valley) from about 5 to about 12 microinches, the ridge-connected surface roughness varied from about 10 to about 79 microinches absolute deviation.

"Aluminum" when used in referring to carrier sheet material will be understood to include aluminum alloys.

BACKGROUND AND SUMMARY OF THE INVENTION

Foil for copper-clad laminates suitable for printed circuit board production have heretofore been made, for the most part, by electrodeposition. The many advantages of this method, including speed of production, economy and a very well developed technology, are, however, offset to a substantial extent by certain disadvantages. A very important disadvantage is the difficulty of producing pinhole-free foils of less than ∼5 microns thickness. Another is the inherent environmental impact of electrodeposition practice. While the pinhole problem may be minimized to some degree by electroplating copper on an aluminum foil carrier surface specially prepared in accordance with the procedure described in U.S. Pat. No. 3,969,199 to Berdan and Luce, it is at the expense of substantially increased processing complexity and cost. In the Berdan et al. process in order to obtain a peel strength that is not in excess of about 2.0 lb/in. the aluminum carrier surface is first given a zincate coating, the zincate coating is substantially all removed by contact with acid and then overplated with a metal, such as zinc.

These shortcomings of the prior art can be avoided through the use of the invention disclosed and claimed in the above-referenced co-pending Ser. No. 499,019.

Then can now also be avoided in still another different way represented by the process of the present invention, which is related to, but different from Ser. No. 499,019 in respects not previously contemplated.

It is a particularly important objective of this invention to be able to utilize certain commercially available aluminum foil as the carrier sheet in the preparation of the laminate precursor leading to the manufacture of copper-clad assemblies for ultimate usage in the preparation of printed circuit boards.

Fully soft aluminum foil is desired in many applications and in making foil for such applications the drawing lubricant can be burned off by heating to 300° C. or even higher. However, in the case of aluminum foil for use as a carrier sheet, retention of the mechanical properties is important. Foil thicknesses employed as carrier sheets are of the order of 0.002 inch thick and must be strong enough to be used in roll form in an unrolling and rerolling operation carried on with a fixed tension. In order to avoid tearing, when such carrier sheet material is separated from the completed copper-clad assembly, it is preferable that the yield strength of the aluminum carrier sheet not be less than about 10,000 psi. This latter, therefore, limits the techniques employable for driving off the surface-contaminating hydrocarbons.

Commercially available chemically cleaned aluminum foil is particularly attractive for this commercially available material retains the full hardness of unannealed severely cold worked aluminum foil. The problem remains, however, that aluminum foil so cleaned still retains on its surfaces a minimum of 0.3 $\mu g/cm^2$ of hydrocarbon contaminants, which is enough to rule out van der Waals absorption as a reliable adhesional force between vapor deposited copper and the aluminum carrier sheet on which it is deposited. It is, therefore, necessary to develop other adhesional forces to provide sufficient peel strength in order to have the aluminum foil/copper layer laminate remain intact until it is desired to remove the aluminum by peeling it away. By the practice of this invention it becomes practical to develop such adhesional forces using specially finished commercially available aluminum foil "as received".

Electron beam evaporation is an especially satisfactory method of carrying out the copper deposition step, carrier surface temperature being readily controllable (i.e. by extracting heat) in various ways under such condition and a film of requisite thickness being quickly established uniformly over the carrier surface as required. We also contemplate, however, the possibility of ion plating deposition of the copper film, which would involve biasing the carrier and, if required, introducing an inert gas such as argon into copper vapor to establish the necessary ionization effect. Again, in the case of ion plating, the carrier surface temperature would be amenable to easy control by a variety of alternatives. Induction (RF) evaporation of the copper instead of electron beam evaporation is also contemplated as a means of producing the vapor phase copper required for physical vapor deposition and again, of course, the carrier surface temperature would be readily controllable. If, however, sputtering is the method of deposition to be carried out in the practice of this invention, it will be necessary for special heat removal measures to be taken in order to maintain carrier surface temperature in the temperature range necessary to predetermine the copper/aluminum bond strength within the desired peel strength range.

It will be understood by those skilled in the art that in whatever manner the invention is carried out to provide the copper film on the carrier surface, thereafter one has the choice of proceeding to produce the laminated body.

DESCRIPTION OF THE INVENTION

The method of this invention comprises the steps of forming a copper film on a carrier by vapor deposition of copper directly on properly cleaned aluminum foil having a matte finish (obtained by pack-rolling of the foil in its final rolling operation) at a temperature between about 0° C. and about 100° C., depositing a substrate bonding layer over the copper film, joining the resulting laminate to a substrate by means of strong adhesion between the said laminate and the substrate and, finally, removing the carrier leaving the exposed surface of the unified copper film/substrate. In the preferred embodiment the substrate bonding layer comprises a metal oxide layer and a coupling agent layer as is disclosed and claimed in Ser. No. 406,588.

Thus, with this particular combination of surface properties for the aluminum foil, i.e., matte finish and surface contamination of hydrocarbons reduced to about 0.4 micrograms per square centimeter or less, it is now possible to obtain the desired peel strength (i.e., carrier release) of between 0.1 and 2.0 pounds per inch (lbs/in) at significantly lower temperatures than was previously thought possible.

BRIEF DESCRIPTION OF THE DRAWINGS

The features of this invention believed to be novel and unobvious over the prior art are set forth with particularity in the appended claims. The invention itself, however, as to the organization, method of operation and objects and advantages thereof, may best be understood by reference to the following description taken in conjunction with the accompanying drawing wherein:

FIG. 1 is a schematic representation in three dimensions illustrating production of the matte finish aluminum foil required in the practice of this invention;

FIGS. 2A and 2B schematically characterize the change in surface roughness between mill finish aluminum foil and pack-rolled aluminum foil, respectively;

MANNER AND PROCESS OF MAKING AND USING THE INVENTION

Figure 5:
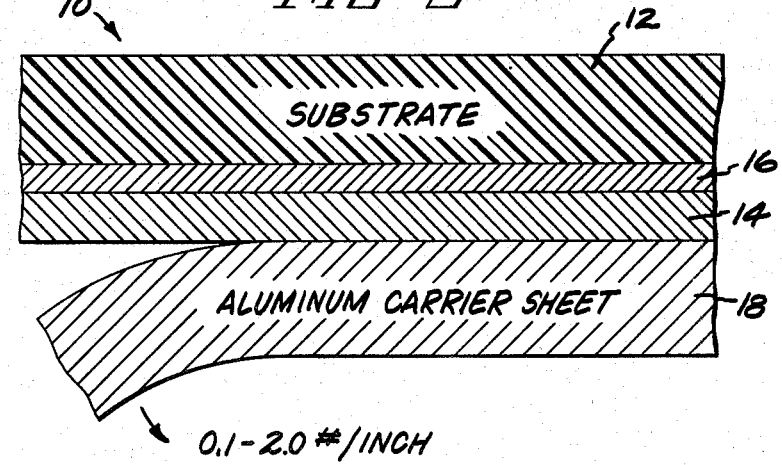
FIG. 5 is a view like that of FIG. 3, after the copper film has been bonded to the substrate.

As illustrated in FIG. 5, a product 10 of this invention as it may appear as an item of commerce for ultimate use in, for example, the production of printed circuit boards, comprises a substrate 12 having a physical vapor-deposited copper film 14 bonded to the surface thereof by a bonding layer 16. It also includes matte finish aluminum carrier sheet 18 having a matte finish surface on which the vapor-deposited copper film 14 had initially been deposited in the novel process of this invention to produce the laminate product shown in FIG. 3. The copper-clad laminate product of FIG. 3 can also be an item of commerce. As will be described hereinafter, the vapor deposition of copper film 14 is conducted under conditions, which will permit ultimate separation of sheet 18 from film 14 by peeling or stripping by the application of force of such small magnitude as not to tear sheet 18 or copper film 14, which is to be configured later as a printed circuit.

One of the key aspects of this invention is the discovery that by using clean matte finish aluminum foil, the desired strength of bond between the vapor-deposited copper film and the aluminum foil carrier can be achieved with the foil maintained at significantly lower temperatures during copper deposition than is the case, when clean foil having a bright finish (very smooth) is used.

Aluminum foil is provided with a matte finish by pack-rolling the foil in its final rolling operation. As is shown in FIG. 1, instead of the usual rolling mill operation in which a single web of aluminum foil is passed between rolls 21, 22 pack-rolling is accomplished by simultaneously passing two webs 23, 24 of aluminum foil between rolls 21, 22. In this final pass, webs 23, 24 are (1) brought to the desired thickness and (2) the inner, or facing, surfaces (23a, 24a) thereof each acquire a matte finish. The outside surfaces of each web will, of course, have their previous, and normal, mill finish, which will depend upon the smoothness of the rolls. FIGS. 2A and 2B show, respectively, a typical rolling mill surface roughness (International Foils) and the resulting matte finish surface roughness (International Foils). The dimensions given represent the absolute distances from surface high points to surface low points (i.e., peak-to-valley distance) for each type of finish. As is evident, the normal rolling mill finish has a high population of sharp ridges (FIG. 2A) and these ridges are substantially absent in the pack-rolled surface. The absolute deviations shown in micrometers in FIG. 2A and 2B convert to microinches as follows:

0.9 micrometers = 35.4 microinches
0.5 micrometers = 19.7 microinches

The surface roughness of matte finish surfaces of aluminum is determined by the amount of cold reduction in the pack-rolling operation—the greater the cold reduction, the coarser the matte finish. In any case, the matte surface is substantially free of the troublesome random scratches encountered in mill finish aluminum foil.

In those instances in which as-rolled aluminum matte surface sheet product, rather than chemically clean commercial aluminum matte surface foil, is the starting material, the process of this invention in its preferred form involves as a first step the cleaning of the carrier sheet. Whether the carrier sheet is as-rolled or is chemically clean, the intent of this invention is to avoid or minimize chemical modification of its surface to prepare bondable surface area, as would result from etching, treatment with zincate solution or other such severe exposure.

Any aluminum foil will typically have over its surfaces a naturally-formed oxide coating of a thickness something less than about 50-Angstroms and, in usual practice, from 10 to 30-Angstroms thick. The matte finish carrier sheet itself is preferably 1 to 7 mils thick, but can be somewhat thinner or much thicker, if desired. Cleaning of the carrier sheet to adequately reduce hydrocarbon contamination at some point in time after the commercial rolling operation is essential to the production of uniform laminate product in which the copper film is adhered to the aluminum sheet with a peel strength having an average value between 0.1 and 2.0 pounds per inch (preferably between 0.2 and 1 pound per inch) as is desirable for subsequent processing and utilization. Fume-cleaning with Freon liquid or other suitable material can be useful but we prefer plasma etching or ozone cleaning, which are techniques known and established in the art for general cleaning purposes, where a consistently high degree of surface cleanliness (i.e., freedom from hydrocarbon contamination) is required.

With the surface of the carrier sheet thus prepared, the application of copper by vapor deposition technique, as described above, is conducted whereby a film of copper is applied to the clean aluminum carrier sheet surface. In accordance with our preference, electron beam evaporation is used and, in any case, the step is carried out to provide a coating which preferably will be an ultra-thin film 5 micrometers (microns) or less in thickness. This coating of copper will be uniformly thick, continuous, smooth, and pinhole-free at about 100 percent of theoretical density with a discernable columnar structure. As deposited in this manner, or by some alternative method such as with induction heating or by ion plating, the copper film will have an average grain size or the order of from a few hundred to a few thousand Angstroms in contrast to the much larger grain size of electroplated copper films running on the order of one to two microns as a minimum.

To achieve this result, the aluminum carrier sheet surface on which the copper film is deposited, is maintained (i.e., cooled) throughout the deposition operation at a temperature from about 0° to about 100° C. Temperatures somewhat higher have been found to result in the establishment of a bond between the copper film and the aluminum carrier sheet, which is strong enough to make mechanical stripping or peeling of the film from the sheet difficult or impossible without damage to the film.

With the establishment of the copper film by vapor deposition technique completed, the resulting laminate assembly is ready for the next step of the process. This involves preparing the copper film for attachment to a substrate and this step may be carried out in accordance with the process disclosed and claimed in U.S. Pat. No. 4,357,395, by the process disclosed and claimed in U.S. Pat. No. 4,383,003, or preferably, by the process disclosed and claimed in Ser. No. 406,588. It will be understood, however, that it may be otherwise treated by present or future methods to accomplish the ultimate desired result in respect to the bonding of the copper film to the substrate body with which it is ultimately to be laminated and used in the production of printed circuit boards or for other purposes.

Substrate bonding having been carried out to produce the finished laminated product, it only remains for the ultimate user to remove the carrier sheet by mechanically stripping or peeling it away by the application of force (i.e. between about 0.1 and 2.0 pounds per inch) such as will not damage either the carrier sheet or the copper film.

The following illustrative, but not limiting, examples are offered in further exposition of the special new features and advantages of the present invention:

EXAMPLE I

Commercially pure aluminum foil (1145-H19) which had been pack-rolled and chemically cleaned (to ~0.35 µg/cm$^2$ of hydrocarbon contamination on the foil by Kaiser Aluminum was coated with approximately 5 µm of physical vapor deposited copper using a small 12 inch vacuum roll coater with a coating drum coolant (water) temperature of 60° C. The foil was coated at a speed of 6 inches per minute during deposition of the copper. The resultant carrier release was 0.2 to 2.0 pounds per inch.

EXAMPLE II

As in example I except foil speed was 20 inches per minute. The resultant carrier release was 0.3 to 0.5 pounds per inch.

EXAMPLE III

As in example I except the coating speed was 48 inches per minute. The carrier release achieved was 0.1 to 0.3 pounds per inch.

EXAMPLE IV

Commercially pure aluminum foil (1100-H19) which was pack-rolled was cleaned using a corona cleaning device. The air gap on the machine was set at 0.060 inches and the electrode encapsulated in quartz. Specimens were cleaned at 8 watts/inch, 12 watts/inch, and 13 watts/inch, all at a foil speed of 5 ft. per minute. Subsequent coating of these materials with copper at 20 inches per minute at a drum temperature of 60° C. produced carrier peels of 0.0 pounds per inch.

EXAMPLE V

As example IV except cleaned at 17 watts per inch produced a carrier peel of 0.5 to 0.55 pounds per inch.

EXAMPLE VI

As in example IV except cleaned 17 watts per inch at 1.5 ft. per minute. This resulted in a carrier peel of 0.15 to 0.45 pounds per inch.

EXAMPLE VII

A commercially pure aluminum foil (1235-H19) which was not pack-rolled but rolled on both sides to a high finish (5µ in) was cleaned by the manufacturer using a corona cleaning system similar to that in example IV. The foil was coated with copper at 20 inches per minute and at 70° C. (drum coolant temperature) resulting in a carrier peel of 0.0 pounds per inch.

It should be evident from the data generated in the experiments described above that several parameters have been correlated in the making of this invention to produce results and advantages to overcome previous limitations in this art. These correlated parameters are the use of matte finish aluminum foil as the carrier, the deposition surface being free of hydrocarbon contamination to 0.4 micrograms/cm$^2$ or less and the deposition thereon of copper with the temperature of the carrier in the range of from about 0° C. to about 100° C.

In the practice of the invention described and claimed in the Green et al. application referred to hereinabove, copper film 14 having been deposited, preferably in the thickness of from 1 to 16 microns (although thicker layers can be used), copper film 14 is then coated with a metal oxide layer (or a mixture of metal oxides) by vapor deposition, usually in the same deposition chamber, in a relatively uniform thickness ranging from about 10 to 500 Angstroms (preferably in the range of 10–100 Angstroms) under vacuum with controlled oxygen and water vapor content as monitored by a residual gas analyzer.

The oxide layer so deposited receives thereafter a coating of a solution of coupling agent. The coupling agent preferably comprises an organosilane. Layer 16 represents the total bonding layer, i.e., oxide plus coupling agent. When the coupling agent material has dried, the assembly of carrier sheet 18, copper film 14, oxide layer and coupling agent layer 16 is bonded to the glass reinforced epoxy board 12 (shown in FIG. 5) using a temperature of about 175° C. simultaneously with the application of pressure of about 150 psi for a time of about 30 to about 40 minutes at temperature. At this point, a copper-clad assembly comprising components 12, 16, 14 and 18 will have been prepared and, when use is to be made of this assembly, aluminum carrier sheet 18 is tripped therefrom to expose layer 14.

In the case of assemblies of smaller area ranging up to about 12 inches by 12 inches, stripping of the carrier sheet 18 from the assembly may be accomplished readily in a hand operation, however, it may be more convenient to utilize a mechanical device for this purpose. In the case of very large area assemblies, it would be preferred to employ mechanical assist in order to apply a more steady, evenly-distributed force to the carrier sheet.

Figure 3:
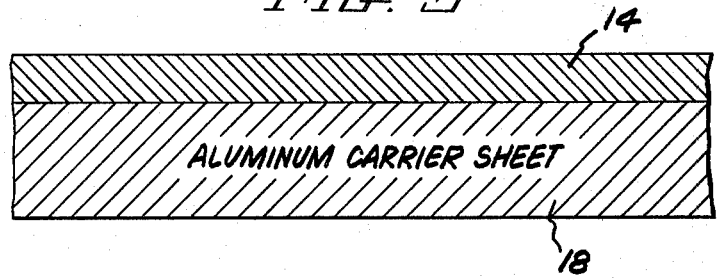
FIG. 3 is a schematic diagram representing a cross-sectional view of an intermediate laminate product of this invention.
Figure 4:
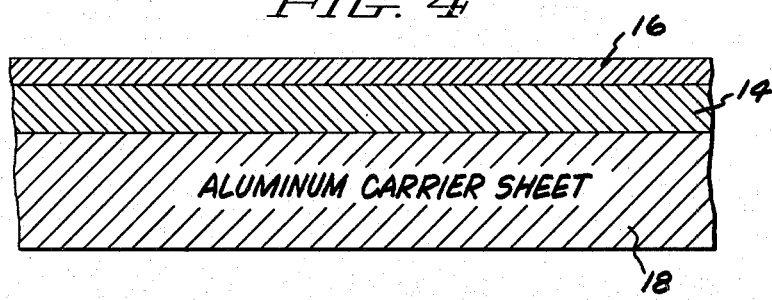
FIG. 4 is a view like that of FIG. 3 of the intermediate laminate product of this invention with a bonding layer applied thereto.

Although this invention has been described utilizing the laminate precursor of FIG. 3 in conjunction with one particular mode of bonding to a substrate to produce the copper-clad assembly, any present or future means of achieving the requisite bonding may be employed without affecting the efficacy of this invention.

The particular manner by which temperature control is effectuated during copper film deposition will depend upon the particular mode of deposition. Thus, in the case of electron beam evaporation it is preferred to pass the carrier sheet over a rotating chill roll and have the evaporated copper impinge on the carrier sheet at the location at which the back surface of the carrier sheet is in close contact with the chill roll to maximize heat transfer. With this arrangement the temperature gradient providing the desired carrier surface temperature can be determined by controlling the temperature of coolant (e.g., water) circulated into and out of the chill roll.

What is claimed is:

1. The method of making a copper-clad laminate which comprises the steps of:
    forming a copper film on a flexible aluminum carrier sheet by vapor depositing copper directly on one clean major surface of said sheet, said major surface having a matte finish and
    simultaneously maintaining the temperature of said major surface in the temperature range from about 0° C. to about 100° C., the temperature being controlled such that the magnitude of the bonding developed between said copper film and bondable surface area of said major surface provides release peel strength therebetween of from about 0.1 to about 2.0 pounds per inch.

2. The method of claim 1 wherein the average hydrocarbon contamination of the major surface of the carrier sheet is less than about 0.4 micrograms per square centimeter.

3. The method of claim 2 wherein the level of hydrocarbon contamination is achieved by cleaning as-rolled aluminum by the process of plasma etch cleaning prior to forming the copper film.

4. The method of claim 1 wherein the copper film is deposited by electron beam evaporation.

5. The method of claim 4 wherein temperature control is effectuated by removing heat from the surface of the carrier sheet opposite the location of the copper deposition.

6. The method of claim 1 wherein the grain formation in the copper film is predominantly columnar.

7. The method of claim 1 wherein the surface roughness of the matte finish has an absolute peak-to-valley difference of less than about 0.5 micrometers.

8. The method of claim 1 wherein the thickness of the copper film deposited is less than about 5 micrometers.

9. The method of making a copper-clad laminate which comprises the steps of:
    forming a copper film on a flexible aluminum carrier sheet by vapor depositing copper directly on one clean major surface of said carrier sheet,
    simultaneously maintaining the temperature of said major surface in the temperature range from about 0° C. to about 100° C., the temperature being controlled such that the magnitude of the bonding developed between said copper film and bondable surface area of said major surface provides release peel strength therebetween of from about 0.1 to about 2.0 pounds per inch,
    preparing the exposed major surface of said copper film for attachment thereof to an insulating substrate,
    placing the prepared copper film surface in juxtaposition with said substrate to form an assembly,
    laminating said assembly and
    peeling said carrier sheet away to expose the surface of said copper film that had been bonded to said carrier sheet.

10. The method of claim 9 wherein the copper film remaining attached to the substrate, after the carrier sheet is peeled away, is substantially pinhole-free.

11. The method of claim 10 wherein the thickness of the copper film is about 5 micrometers or less.

* * * * *